US008643167B2

(12) United States Patent
Hung et al.

(10) Patent No.: US 8,643,167 B2
(45) Date of Patent: Feb. 4, 2014

(54) SEMICONDUCTOR PACKAGE WITH THROUGH SILICON VIAS AND METHOD FOR MAKING THE SAME

(75) Inventors: Chia-Lin Hung, Zhongli (TW);
Jen-Chuan Chen, Bade (TW);
Hui-Shan Chang, Jhongli (TW);
Kuo-Pin Yang, Kaohsiung (TW)

(73) Assignee: Advanced Semiconductor Engineering, Inc. (TW)

( * ) Notice: Subject to any disclaimer, the term of this patent is extended or adjusted under 35 U.S.C. 154(b) by 0 days.

(21) Appl. No.: 13/311,364

(22) Filed: Dec. 5, 2011

(65) Prior Publication Data

US 2012/0175767 A1    Jul. 12, 2012

(30) Foreign Application Priority Data

Jan. 6, 2011 (TW) .............................. 100100425 A

(51) Int. Cl.
*H01L 23/04* (2006.01)
*H01L 23/34* (2006.01)

(52) U.S. Cl.
USPC ........................... 257/698; 257/724; 257/725

(58) Field of Classification Search
USPC .................................. 257/698, 723, 724, 725
See application file for complete search history.

(56) References Cited

U.S. PATENT DOCUMENTS

| | | | |
|---|---|---|---|
| 3,761,782 A | 9/1973 | Youmans | |
| 4,394,712 A | 7/1983 | Anthony | |
| 4,499,655 A | 2/1985 | Anthony | |
| 4,807,021 A | 2/1989 | Okumura | |
| 4,842,699 A | 6/1989 | Hua et al. | |
| 4,897,708 A | 1/1990 | Clements | |
| 4,982,265 A | 1/1991 | Watanabe et al. | |
| 5,128,831 A | 7/1992 | Fox, III et al. | |
| 5,166,097 A | 11/1992 | Tanielian | |
| 5,191,405 A | 3/1993 | Tomita et al. | |
| 5,222,014 A | 6/1993 | Lin | |
| 5,229,647 A | 7/1993 | Gnadinger | |
| 5,239,448 A | 8/1993 | Perkins et al. | |
| 5,308,443 A | 5/1994 | Sugihara | |
| 5,355,580 A | 10/1994 | Tsukada | |
| 5,404,044 A | 4/1995 | Booth et al. | |
| 5,579,207 A | 11/1996 | Hayden et al. | |
| 5,594,275 A | 1/1997 | Kwon et al. | |
| 5,608,265 A | 3/1997 | Kitano et al. | |
| 5,615,477 A | 4/1997 | Sweitzer | |
| 5,643,831 A | 7/1997 | Ochiai et al. | |
| 5,714,800 A | 2/1998 | Thompson | |
| 5,726,493 A | 3/1998 | Yamashita et al. | |
| 5,748,452 A | 5/1998 | Londa | |
| 5,763,939 A | 6/1998 | Yamashita | |
| 5,844,315 A | 12/1998 | Melton et al. | |
| 5,861,666 A | 1/1999 | Bellaar | |

(Continued)

FOREIGN PATENT DOCUMENTS

| CN | 101266967 A | 9/2008 |
|---|---|---|
| CN | 101350322 A | 1/2009 |

(Continued)

*Primary Examiner* — Ngan Ngo

(74) *Attorney, Agent, or Firm* — Morgan Law Offices, PLC

(57) ABSTRACT

The present invention relates to a stacked semiconductor package and a method for making the same. The method includes the steps of mounting a plurality of first dice to a wafer by conducting a reflow process; and thinning the wafer from the backside surface of the wafer, thereby reducing manufacturing time and preventing warpage.

20 Claims, 12 Drawing Sheets

(56) References Cited

U.S. PATENT DOCUMENTS

| | | | |
|---|---|---|---|
| 5,883,426 | A | 3/1999 | Tokuno et al. |
| 5,892,290 | A | 4/1999 | Chakravorty et al. |
| 5,973,393 | A | 10/1999 | Chia et al. |
| 5,985,695 | A | 11/1999 | Freyman et al. |
| 5,998,292 | A | 12/1999 | Black et al. |
| 6,177,724 | B1 | 1/2001 | Sawai |
| 6,194,250 | B1 | 2/2001 | Melton et al. |
| 6,195,268 | B1 | 2/2001 | Eide |
| 6,276,599 | B1 | 8/2001 | Ogawa |
| 6,303,997 | B1 | 10/2001 | Lee |
| 6,329,631 | B1 | 12/2001 | Yueh |
| 6,406,934 | B1 | 6/2002 | Glenn et al. |
| 6,448,506 | B1 | 9/2002 | Glenn et al. |
| 6,451,624 | B1 | 9/2002 | Farnworth et al. |
| 6,457,633 | B1 | 10/2002 | Takashima et al. |
| 6,489,676 | B2 | 12/2002 | Taniguchi et al. |
| 6,501,165 | B1 | 12/2002 | Farnworth et al. |
| 6,577,013 | B1 | 6/2003 | Glenn et al. |
| 6,614,104 | B2 | 9/2003 | Farnworth et al. |
| 6,670,269 | B2 | 12/2003 | Mashino |
| 6,699,787 | B2 | 3/2004 | Mashino |
| 6,740,546 | B2 | 5/2004 | Corisis et al. |
| 6,740,950 | B2 | 5/2004 | Paek |
| 6,740,964 | B2 | 5/2004 | Sasaki |
| 6,798,057 | B2 | 9/2004 | Bolkin et al. |
| 6,812,066 | B2 | 11/2004 | Taniguchi et al. |
| 6,812,549 | B2 | 11/2004 | Umetsu et al. |
| 6,815,254 | B2 | 11/2004 | Mistry et al. |
| 6,815,348 | B2 | 11/2004 | Mashino |
| 6,828,665 | B2 | 12/2004 | Pu et al. |
| 6,847,109 | B2 | 1/2005 | Shim |
| 6,861,288 | B2 | 3/2005 | Shim et al. |
| 6,888,255 | B2 | 5/2005 | Murtuza et al. |
| 6,924,550 | B2 | 8/2005 | Corisis et al. |
| 6,936,930 | B2 | 8/2005 | Wang |
| 6,962,829 | B2 | 11/2005 | Glenn et al. |
| 6,974,334 | B2 | 12/2005 | Hung |
| 7,002,805 | B2 | 2/2006 | Lee |
| 7,015,571 | B2 | 3/2006 | Chang et al. |
| 7,026,709 | B2 | 4/2006 | Tsai et al. |
| 7,029,953 | B2 | 4/2006 | Sasaki |
| 7,034,386 | B2 | 4/2006 | Kurita |
| 7,049,692 | B2 | 5/2006 | Nishimura et al. |
| 7,061,079 | B2 | 6/2006 | Weng et al. |
| 7,078,269 | B2 | 7/2006 | Yamasaki et al. |
| 7,109,068 | B2 * | 9/2006 | Akram et al. ............ 438/128 |
| 7,134,198 | B2 | 11/2006 | Nakatani |
| 7,157,372 | B1 | 1/2007 | Trezza |
| 7,185,426 | B1 | 3/2007 | Hiner et al. |
| 7,187,068 | B2 | 3/2007 | Suh et al. |
| 7,215,032 | B2 | 5/2007 | Trezza |
| 7,222,420 | B2 | 5/2007 | Moriizumi |
| 7,238,590 | B2 | 7/2007 | Yang et al. |
| 7,242,081 | B1 | 7/2007 | Lee |
| 7,247,517 | B2 * | 7/2007 | Rumer et al. ............ 438/107 |
| 7,262,080 | B2 | 8/2007 | Go et al. |
| 7,262,475 | B2 | 8/2007 | Kwon et al. |
| 7,276,787 | B2 | 10/2007 | Edelstein et al. |
| 7,279,784 | B2 | 10/2007 | Liu |
| 7,279,789 | B2 | 10/2007 | Cheng |
| 7,285,434 | B2 | 10/2007 | Yee et al. |
| 7,288,835 | B2 | 10/2007 | Yim et al. |
| 7,298,030 | B2 | 11/2007 | McWilliams et al. |
| 7,309,913 | B2 | 12/2007 | Shim et al. |
| 7,334,326 | B1 | 2/2008 | Huemoeller et al. |
| 7,335,994 | B2 * | 2/2008 | Klein et al. ............ 257/778 |
| 7,345,361 | B2 | 3/2008 | Mallik et al. |
| 7,354,800 | B2 | 4/2008 | Carson |
| 7,364,945 | B2 | 4/2008 | Shim et al. |
| 7,365,427 | B2 | 4/2008 | Lu et al. |
| 7,365,436 | B2 | 4/2008 | Yamano |
| 7,371,602 | B2 | 5/2008 | Yee |
| 7,372,141 | B2 | 5/2008 | Karnezos et al. |
| 7,388,293 | B2 | 6/2008 | Fukase et al. |
| 7,408,244 | B2 | 8/2008 | Lee et al. |
| 7,415,762 | B2 | 8/2008 | Fukase et al. |
| 7,417,329 | B2 | 8/2008 | Chuang et al. |
| 7,429,786 | B2 | 9/2008 | Karnezos et al. |
| 7,429,787 | B2 | 9/2008 | Karnezos et al. |
| 7,436,055 | B2 | 10/2008 | Hu |
| 7,436,074 | B2 | 10/2008 | Pan et al. |
| 7,473,629 | B2 | 1/2009 | Tai et al. |
| 7,482,272 | B2 | 1/2009 | Trezza |
| 7,508,057 | B2 | 3/2009 | Shiraishi et al. |
| 7,508,079 | B2 | 3/2009 | Higashi |
| 7,528,053 | B2 | 5/2009 | Huang et al. |
| 7,538,033 | B2 | 5/2009 | Trezza |
| 7,550,832 | B2 | 6/2009 | Weng et al. |
| 7,550,836 | B2 | 6/2009 | Chou et al. |
| 7,553,752 | B2 | 6/2009 | Kuan et al. |
| 7,560,744 | B2 | 7/2009 | Hsiao et al. |
| 7,560,818 | B2 | 7/2009 | Tsai |
| 7,586,184 | B2 | 9/2009 | Hung et al. |
| 7,589,408 | B2 | 9/2009 | Weng et al. |
| 7,589,426 | B2 * | 9/2009 | Jiang et al. ............ 257/780 |
| 7,598,163 | B2 | 10/2009 | Callahan et al. |
| 7,605,463 | B2 | 10/2009 | Sunohara |
| 7,625,818 | B2 | 12/2009 | Wang |
| 7,642,132 | B2 | 1/2010 | Huang et al. |
| 7,642,133 | B2 | 1/2010 | Wu et al. |
| 7,656,023 | B2 | 2/2010 | Sunohara et al. |
| 7,659,202 | B2 | 2/2010 | Trezza |
| 7,666,711 | B2 | 2/2010 | Pagaila et al. |
| 7,678,685 | B2 | 3/2010 | Sunohara et al. |
| 7,681,779 | B2 | 3/2010 | Yang |
| 7,687,397 | B2 | 3/2010 | Trezza |
| 7,691,747 | B2 | 4/2010 | Lin et al. |
| 7,719,094 | B2 | 5/2010 | Wu et al. |
| 7,723,839 | B2 | 5/2010 | Yano et al. |
| 7,733,661 | B2 | 6/2010 | Kossives et al. |
| 7,741,148 | B1 | 6/2010 | Marimuthu et al. |
| 7,741,152 | B2 | 6/2010 | Huang et al. |
| 7,741,156 | B2 | 6/2010 | Pagaila et al. |
| 7,772,081 | B2 | 8/2010 | Lin et al. |
| 7,772,118 | B2 | 8/2010 | Yamano |
| 7,777,351 | B1 | 8/2010 | Berry et al. |
| 7,786,008 | B2 | 8/2010 | Do et al. |
| 7,786,592 | B2 | 8/2010 | Trezza |
| 7,795,140 | B2 | 9/2010 | Taguchi et al. |
| 7,808,060 | B2 | 10/2010 | Hsiao |
| 7,808,111 | B2 | 10/2010 | Trezza |
| 7,811,858 | B2 | 10/2010 | Wang et al. |
| 7,816,265 | B2 | 10/2010 | Wang |
| 7,838,334 | B2 | 11/2010 | Yu et al. |
| 7,838,337 | B2 * | 11/2010 | Marimuthu et al. ........ 438/110 |
| 7,842,597 | B2 | 11/2010 | Tsai |
| 8,294,261 | B2 * | 10/2012 | Mawatari et al. ............ 257/712 |
| 2002/0017855 | A1 | 2/2002 | Cooper et al. |
| 2002/0094605 | A1 | 7/2002 | Pai et al. |
| 2003/0107119 | A1 * | 6/2003 | Kim ............ 257/686 |
| 2004/0124518 | A1 | 7/2004 | Karnezos |
| 2004/0259292 | A1 | 12/2004 | Beyne et al. |
| 2005/0067714 | A1 * | 3/2005 | Rumer et al. ............ 257/778 |
| 2005/0117835 | A1 | 6/2005 | Nguyen et al. |
| 2005/0121764 | A1 | 6/2005 | Mallik |
| 2005/0136634 | A1 * | 6/2005 | Savastiouk et al. ........ 438/597 |
| 2005/0189635 | A1 | 9/2005 | Humpston et al. |
| 2005/0189636 | A1 * | 9/2005 | Savastiouk et al. ........ 257/678 |
| 2005/0258545 | A1 | 11/2005 | Kwon |
| 2006/0027632 | A1 | 2/2006 | Akram |
| 2006/0046350 | A1 * | 3/2006 | Jiang et al. ............ 438/114 |
| 2006/0197216 | A1 | 9/2006 | Yee |
| 2006/0220210 | A1 | 10/2006 | Karnezos et al. |
| 2006/0244117 | A1 | 11/2006 | Karnezos et al. |
| 2007/0048896 | A1 | 3/2007 | Andry et al. |
| 2007/0108583 | A1 | 5/2007 | Shim et al. |
| 2007/0138562 | A1 | 6/2007 | Trezza |
| 2007/0187711 | A1 | 8/2007 | Hsiao et al. |
| 2007/0241453 | A1 | 10/2007 | Ha et al. |
| 2007/0273049 | A1 | 11/2007 | Khan et al. |
| 2007/0290376 | A1 | 12/2007 | Zhao et al. |
| 2008/0017968 | A1 | 1/2008 | Choi et al. |
| 2008/0073769 | A1 | 3/2008 | Wu et al. |
| 2008/0272486 | A1 | 11/2008 | Wang et al. |

(56) References Cited

U.S. PATENT DOCUMENTS

| | | | |
|---|---|---|---|
| 2009/0032928 A1 | 2/2009 | Chiang et al. | |
| 2009/0039527 A1 | 2/2009 | Chan et al. | |
| 2009/0140436 A1 | 6/2009 | Wang | |
| 2009/0146297 A1 | 6/2009 | Badakere et al. | |
| 2009/0166785 A1 | 7/2009 | Camacho et al. | |
| 2009/0243045 A1 | 10/2009 | Pagaila et al. | |
| 2009/0294959 A1 | 12/2009 | Chiang et al. | |
| 2009/0302435 A1 | 12/2009 | Pagaila et al. | |
| 2009/0302437 A1 | 12/2009 | Kim et al. | |
| 2009/0309235 A1 | 12/2009 | Suthiwongsunthorn et al. | |
| 2009/0321916 A1 | 12/2009 | Wang et al. | |
| 2010/0000775 A1 | 1/2010 | Shen et al. | |
| 2010/0059855 A1 | 3/2010 | Lin et al. | |
| 2010/0065948 A1 | 3/2010 | Bae et al. | |
| 2010/0133704 A1 | 6/2010 | Marimuthu et al. | |
| 2010/0140737 A1 | 6/2010 | Lin et al. | |
| 2010/0140751 A1 | 6/2010 | Tay et al. | |
| 2010/0140752 A1 | 6/2010 | Marimuthu et al. | |
| 2010/0140776 A1 | 6/2010 | Trezza | |
| 2010/0148316 A1 | 6/2010 | Kim et al. | |
| 2010/0171205 A1 | 7/2010 | Chen et al. | |
| 2010/0171206 A1 | 7/2010 | Chu et al. | |
| 2010/0171207 A1 | 7/2010 | Shen et al. | |
| 2010/0187681 A1 | 7/2010 | Chen et al. | |
| 2010/0197134 A1 | 8/2010 | Trezza | |
| 2010/0230759 A1 | 9/2010 | Yang et al. | |
| 2010/0230760 A1 | 9/2010 | Hung | |
| 2010/0230788 A1 | 9/2010 | Peng | |
| 2010/0244244 A1 | 9/2010 | Yang | |
| 2010/0276690 A1 | 11/2010 | Chen | |
| 2010/0327465 A1 | 12/2010 | Shen et al. | |
| 2011/0024916 A1* | 2/2011 | Marimuthu et al. | 257/774 |
| 2011/0048788 A1 | 3/2011 | Wang et al. | |
| 2011/0068437 A1 | 3/2011 | Chiu et al. | |
| 2011/0215470 A1* | 9/2011 | Chen et al. | 257/738 |
| 2012/0021564 A1* | 1/2012 | Chen et al. | 438/108 |
| 2012/0043656 A1* | 2/2012 | Hayashi | 257/738 |
| 2012/0175786 A1* | 7/2012 | Kiong et al. | 257/778 |
| 2012/0181689 A1* | 7/2012 | Do et al. | 257/737 |
| 2012/0280402 A1* | 11/2012 | Pagaila et al. | 257/774 |
| 2012/0280403 A1* | 11/2012 | Pagaila et al. | 257/774 |
| 2013/0001771 A1* | 1/2013 | Pagaila et al. | 257/737 |
| 2013/0059417 A1* | 3/2013 | Kikuchi et al. | 438/109 |

FOREIGN PATENT DOCUMENTS

| | | |
|---|---|---|
| CN | 101807559 A | 2/2009 |
| CN | 101436554 A | 5/2009 |
| JP | 2002246540 A | 8/2002 |
| JP | 2004228135 A | 8/2004 |
| TW | 200612539 A | 4/2006 |

* cited by examiner

US 8,643,167 B2

SEMICONDUCTOR PACKAGE WITH THROUGH SILICON VIAS AND METHOD FOR MAKING THE SAME

CROSS-REFERENCE TO RELATED APPLICATIONS

This application claims the benefit of Taiwan application Serial No. 100100425, filed on Jan. 6, 2011, the subject matter of which is incorporated herein by reference.

BACKGROUND OF THE INVENTION

1. Field of the Invention

The present invention relates to semiconductor packaging, and more particularly, to 3D semiconductor packaging employing through silicon via (TSV) technology.

2. Description of the Related Art

Through silicon via (TSV) has become an increasingly popular technique in the field of 3D semiconductor packaging. In TSV, chips can be stacked on top of one another, and connected using conductive vias which are vertical pathways of interconnects that run through the chips.

Conventionally, a three-dimensional semiconductor package is formed by stacking two dice on a substrate, wherein a bottom die has a plurality of through silicon vias (TSV) which protrude from a surface of the bottom die, and another surface of the bottom die has a plurality of bumps. In the conventional method, the thinned bottom die is mounted to the package substrate directly by thermal compression bonding (TCB), and then the top die is stacked on the bottom die by the same method.

However, this conventional method encounters several serious problems. First, transportation of the thinned bottom die is a challenge. Second, during the process of stacking the bottom die, warpage of the package substrate can occur leading to problems such as a low yield rate, failure during the process of at mounting bumps, and so on. Moreover, die mounting by TCB is a relatively inefficient manufacturing process.

SUMMARY OF THE INVENTION

One aspect of the disclosure relates to a method for making a semiconductor package. In one embodiment, the method comprises providing a wafer, the wafer having a contact surface and a backside surface, the contact surface including a plurality of pads disposed thereon, each of the pads having a bump; mounting a plurality of first die to the contact surface of the wafer, each of the first die having a plurality of conductive vias formed therein, wherein protruding ends of the conductive vias electrically connect to the pads by the bumps; placing the wafer and the plurality of first die in a reflow oven; forming a first protective layer between each of the first die and the contact surface, and thinning the wafer from the backside surface of the wafer. The thickness of the wafer is reduced from about 760 µm to about 50 µm.

After the wafer is thinned, the wafer is cut to form a plurality of combo die, each of the combo die comprising one of the plurality of the first die and a second die cut from the wafer. A package substrate is then provided, the package substrate having a first package surface and a second package surface. The plurality of combo die are mounted to the first package surface, and the package substrate is cut to form a plurality of stacked semiconductor packages. In an embodiment, where the second die is lesser in width than the first die, an insulating layer is disposed at the periphery of the second die. In another embodiment, the method further includes forming a plurality of internal solder balls on the first package surface of the package substrate wherein a protection layer is formed between the internal solder balls; forming a molding compound on the first package surface of the package substrate to encapsulate the combo dice; and forming a plurality of openings on the molding compound to expose the internal solder balls.

Another aspect of the disclosure relates to a stacked semiconductor package that includes a package substrate, having a first package surface and a second package surface; a first die, mounted to the package substrate, the first die comprising a first die body, a plurality of conductive vias and a plurality of bumps, the first die body having a first surface and a second surface, the conductive vias protruding from the second surface of the first die body, the bumps being disposed adjacent to the first surface of the first die body and electrically connected to the conductive vias, and the bumps being electrically connected to the first package surface of the package substrate; a second protection layer, disposed between the first package surface of the package substrate and the first surface of the first die body to protect the bumps; a second die, having a contact surface and a backside surface, wherein the second die is mounted to the conductive vias of the first die by a reflow process; and a first protection layer, disposed between the second surface of the first die body and the contacted surface of the second die to protect the conductive vias.

BRIEF DESCRIPTION OF THE DRAWINGS

Common reference numerals are used throughout the drawings and the detailed description to indicate the same elements. The present invention will be more apparent from the following detailed description taken in conjunction with the accompanying drawings.

DETAILED DESCRIPTION OF THE INVENTION

Figure 1:
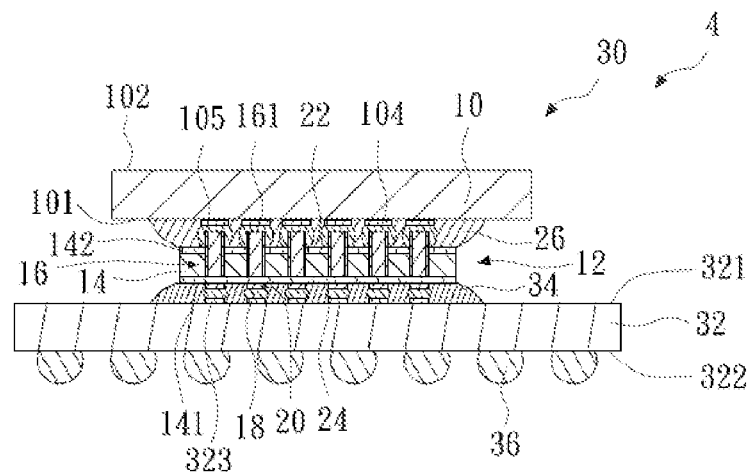
FIG. 1 is cross-sectional view illustrating a stacked semiconductor package according to an embodiment of the present invention.

Referring to FIG. 1, a cross-sectional view of a stacked semiconductor package 4, according to an embodiment of the present invention, is illustrated. The stacked semiconductor package 4 includes a package substrate 32, a first die 12, a second die 10, a first protection layer 26 and a second protection layer 34. In this embodiment, the first die 12 is an active die and has a functional layer 24 disposed on a first surface 141 of the first die 12. However, in other embodiments, the first die 12 can be an interposer.

The first die 12 comprises a first die body 14, a plurality of conductive vias 16 and a plurality of first bumps 18. The first die body 14 is a semiconductor material, such as silicon, and has a second surface 142 opposite to the first surface 141. The conductive vias 16, also referred to as "through silicon vias" (TSV) include a conductive material, such as, copper, gold, aluminum, silver, etc., and protrude from the second surface 142 of the first die 12.

The first bumps 18 are disposed adjacent to the first surface 141 of the first die 12 and electrically connected to the conductive vias 16 and the first substrate surface 321 of the package substrate 32. In this embodiment, the first bumps 18 are copper pillars capped with solder. However, in other embodiments, the first bumps 18 may be copper pillar only or solder only (e.g., solder balls).

A plurality of first pads 20 are disposed on the functional layer 24, and the first bumps 18 are disposed on the first pads 20. A surface finish layer (not shown) is disposed on a protruding end 161 of each of the conductive vias 16 by plating or other deposition methods. The surface finish layer is a single conductive material, such as nickel (Ni), gold (Au), or a layered conductive structure, such as, for example, a nickel-gold (Ni—Au) layer.

The second die 10 is an active die and has a contact surface 101 and a backside surface 102. The second die 10 is coupled to the conductive vias 16 of the first die 12. In this embodiment, the second die 10 further comprises a plurality of second pads 104. The second pads 104 are disposed adjacent to the contact surface 101 of the second die 10. The second pads 104 are electrically connected to the conductive vias 16 by a plurality of second bumps 105. In this embodiment, the X-Y dimension of the first die 12, i.e., the surface area of the first die 12, is less than that of the second die 10. The second bumps 105 are made of conductive solder, such as, for example, tin-silver (SnAg) solder, and disposed on the second pads 104 or, alternatively, are disposed between the conductive vias 16 and the second pads 104. In other embodiments, the second bumps 105 may be copper pillars capped with solder or copper pillars only. In this embodiment, the protruding end 161 of the conductive via 16 contacts the second bump 105 and therefore is electrically connected to the second pad 104.

The first protection layer 26 is disposed between the second surface 142 of the first die body 14 and the contact surface 101 of the second die 10 to protect the interconnections between the conductive vias 16 and the second bumps 105. In this embodiment, the first protection layer 26 is an underfill.

The package substrate 32 is an organic substrate and has a first substrate surface 321 and a second substrate surface 322. The first die 12 is coupled to the package substrate 32 by the first bumps 18. The package substrate 32 further comprises a plurality of substrate pads 323 disposed on the first substrate surface 321 and the first bumps 18 are electrically connected to the substrate pads 323. The stacked semiconductor package 4 further includes a plurality of external solder balls 36 disposed on the second substrate surface 322 of the package substrate 32.

A second protection layer 34 is disposed between the package substrate 32 and the first die 12 to protect the interconnection between the first die 12 and the substrate 32. In this embodiment, the second protection layer 34 is a non conductive paste, such as, a polymer paste, epoxy paste or acrylic paste. In this embodiment, the second protection layer 34 is of a different material from the first protection layer 26 and the viscosity of the second protection layer 34 is greater than that of first protection layer 26.

Figure 2:
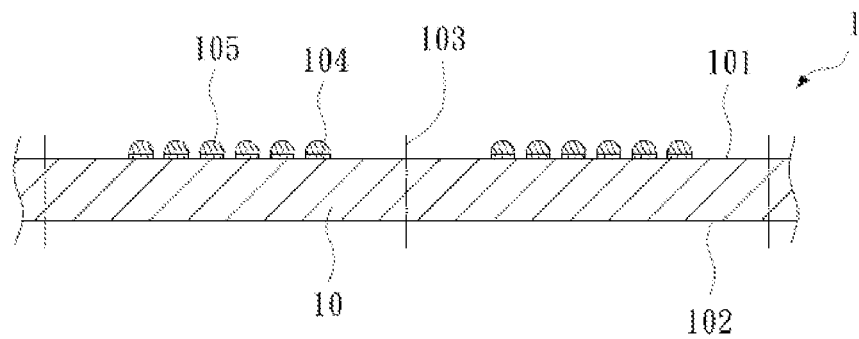
FIGS. 2 to 11 are cross-sectional views illustrating a method for making the stacked semiconductor package of FIG. 1, according to an embodiment of the present invention.

Referring to FIGS. 2 to 11, cross-sectional views of a method for making the stacked semiconductor package 4, according to an embodiment of the present invention, are illustrated. Referring to FIG. 2, a wafer 1 is provided. The wafer 1 has a contact surface 101 and a backside surface 102. In this embodiment, the wafer 1 is made of a semiconductor material, such as, for example, silicon, germanium, etc. The wafer 1 includes a plurality of cutting lines 103. The cutting lines 103 define a plurality of second dice 10. That is, after the wafer 1 is cut along the cutting lines 103, the second dice 10 are formed. Preferably, the wafer 1 further has a plurality of second pads 104 and a plurality of second bumps 105. The second pads 104 are made of a conductive material, such as, for example, aluminum, silver, copper, gold, etc., and disposed on the contact surface 101 of the wafer 1. The second bumps 105 are made of conductive solder, such as, for example, tin-silver (SnAg) solder, and disposed on the second pads 104. In other embodiments, the second bumps 105 are a copper pillar and solder combination or copper pillars only. In the present embodiment, the second dice 10 are memory dice. However, in other embodiments, the second dice 10 may be processor dice, for example.

Figure 3:
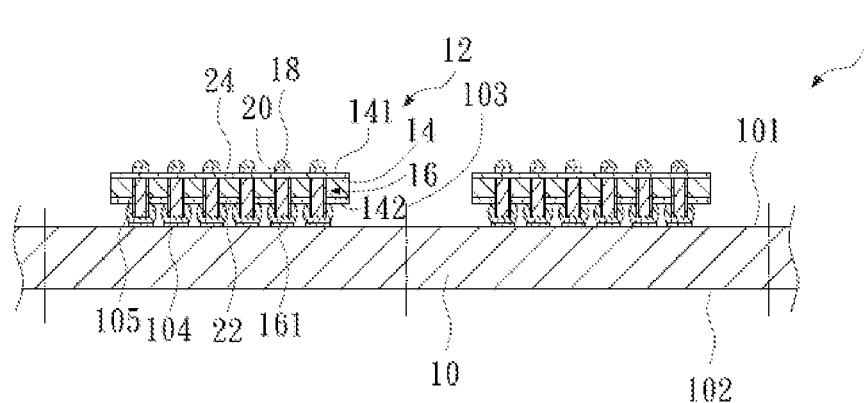

Referring to FIG. 3, a plurality of first dice 12 are provided. Each of the first dice 12 comprises a first die body 14, a plurality of conductive vias 16 formed in the die body 14, and a plurality of first bumps 18. In this embodiment, the first die body 14 is made of semiconductor material, such as, for example, silicon, germanium, etc., and has a first surface 141 and a second surface 142. The conductive vias 16 are made of conductive material, such as, for example, copper, gold, aluminum, silver, etc. The conductive vias 16 protrude from the second surface 142 of the first die body 14 and are positioned to correspond to the second pads 104. The bumps first 18 are disposed adjacent to the first surface 141 and electrically connected to the conductive vias 16. In this embodiment, the first bumps 18 are layered structures made of copper pillar and solder. In other embodiments, the first bumps 18 may be made of copper pillar only or solder only.

In this embodiment, the first dice 12 are functional dice. Preferably, the first dice 12 are processor dice; however, in the other embodiments, the first dice 12 can be interposer dice. Each of the first dice 12 may further comprises a passivation layer 22, a functional layer 24, a surface finish layer (not shown) and a plurality of first pads 20. The passivation layer 22 is disposed on the second surface 142, and the material thereof is a polymer material, such as benzocyclobutene (BCB), polyimide (PI), polybenzoxazole (PBO), etc., or an inorganic insulating layer, such as silicon dioxide (SiO$_2$). The functional layer 24 is disposed on the first surface 141 of the first dice 12. The first pads 20 are disposed on the functional layer 24, and the first bumps 18 are disposed on the first pads 20. The surface finish layer (not shown) is disposed on protruding ends 161 of the conductive vias 16, and made of a conductive material, such as nickel (Ni), gold (Au), or a layered nickel-gold (Ni—Au) combination.

Then, the first dice 12 are mounted to the contact surface 101 of the wafer 1 by a flux layer (not shown). In this embodiment, the protruding end 161 of the conductive vias 16 contacts the second bumps 105 and therefore is electrically connected to the second pads 104 of the wafer 1.

Then, the wafer 1 and the first dice 12 disposed on the wafer 1 are put into a reflow oven together, and a reflow process is conducted on the first dice 12 and the wafer 1. In this embodiment, thermal compression bonding (TCB) is not used, so the protruding end 161 of each of the conductive vias 16 does not contact the second pads 104. Shape deformation of the second bumps 105 is significantly less than that would be caused by conventional thermal compression bonding.

Figure 4:
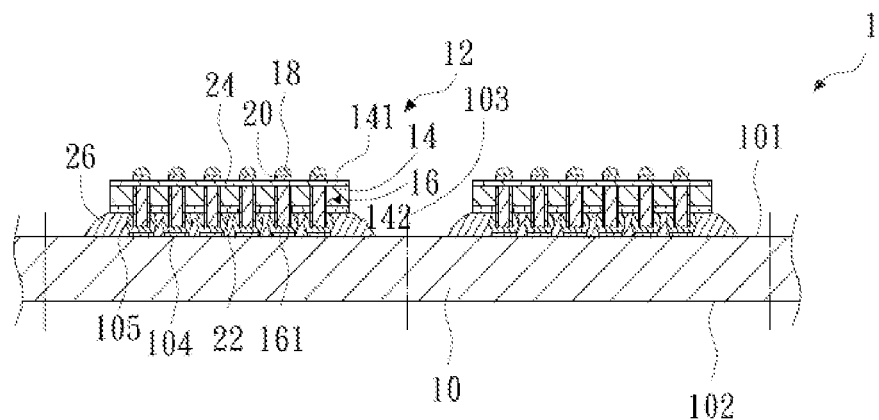

Referring to FIG. 4, a first protection layer 26 is formed between the first dice 12 and the contact surface 101 of the wafer 1 to protect the interconnections between the conductive vias 16 and the second bumps 105. In this embodiment, the first protection layer 26 is an underfill, preferably a capillary underfill (CUF). The viscosity of the first protection layer 26 is about 100 Pa-s, and the first protection layer 26 fills between the second bumps 105 by capillary action.

Figure 5:
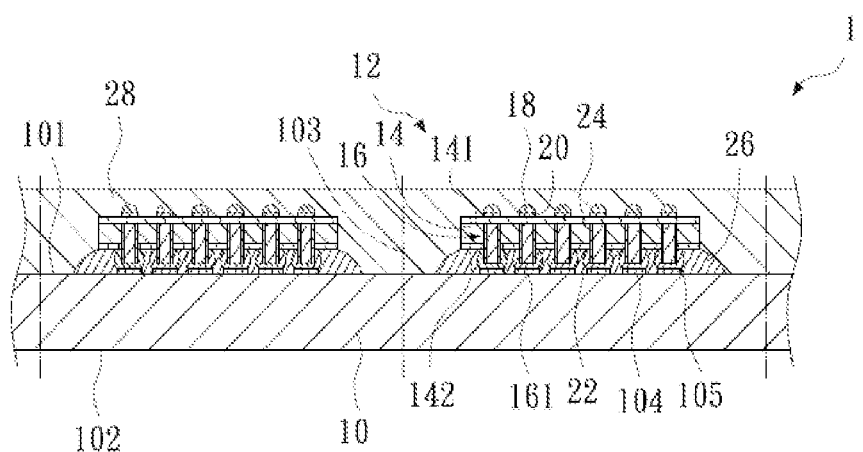
Figure 6:
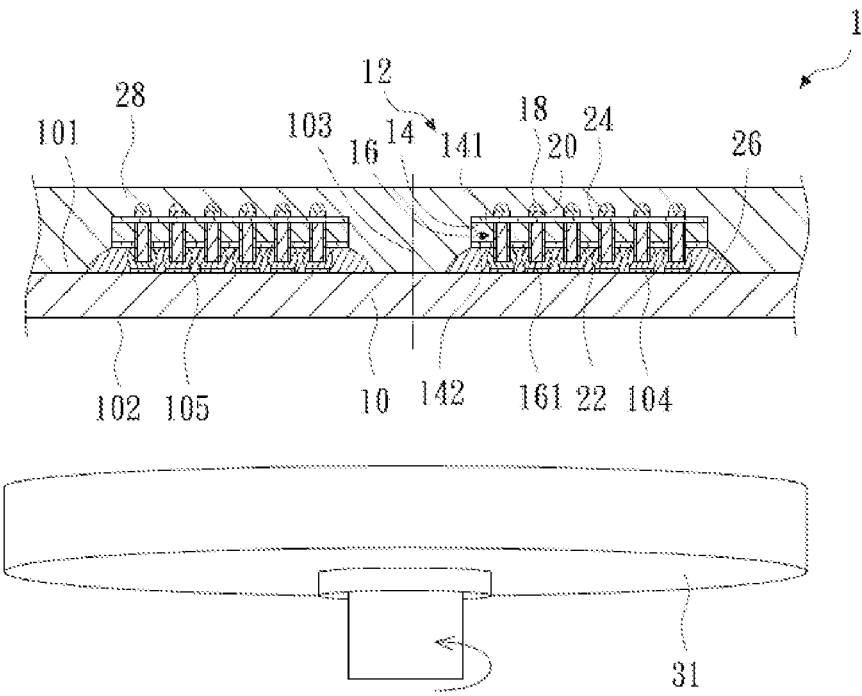

Referring to FIG. 5, the contact surface 101 of the wafer 1 and the first dice 12 disposed on the wafer 1 are adhered to a backside grinding tape (BSG Tape) 28, and the backside surface 102 of the wafer 1 is exposed. Referring to FIG. 6, the backside surface 102 of the wafer 1 is ground by a grinding machine 31 to thin the wafer 1, so the thickness of the wafer 1 is reduced from about 760 μm in FIG. 1 to about 50 μm. Afterwards, the backside grinding tape 28 is removed.

Figure 7:
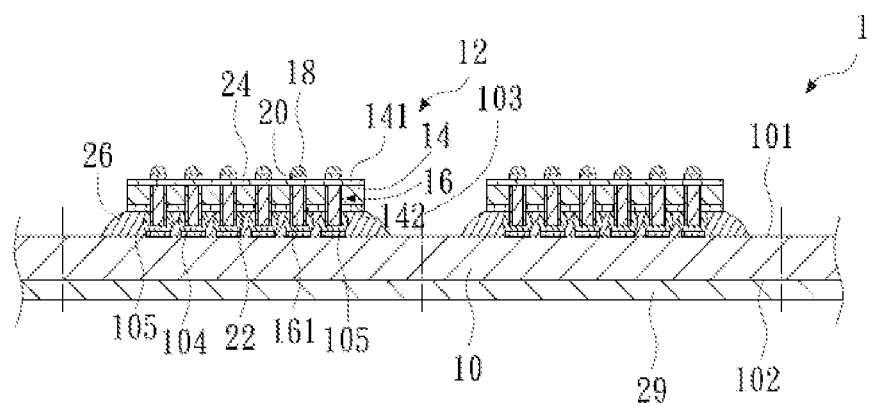
Figure 8:
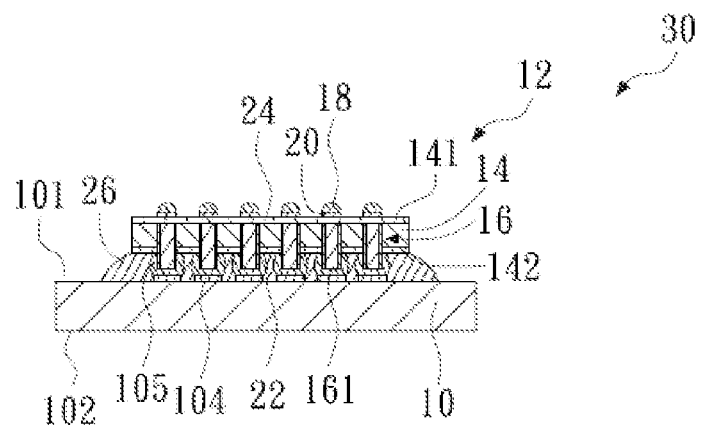

Referring to FIG. 7, the backside surface 102 of the wafer 1 is adhered to a dicing tape (DC Tape) 29, and the contact surface 101 of the wafer 1 and the first dice 12 disposed on the wafer 1 are exposed. Referring to FIG. 8, the wafer 1 is cut along the cutting lines 103 to form a plurality of combo dice 30. Each of the combo dice 30 comprises a first die 12 and a second die 10, wherein the width of the first die 12 is less than that of the second die 10. In this embodiment, the wafer 1 is cut by a mechanical sawing method or a laser sawing method.

Figure 9:
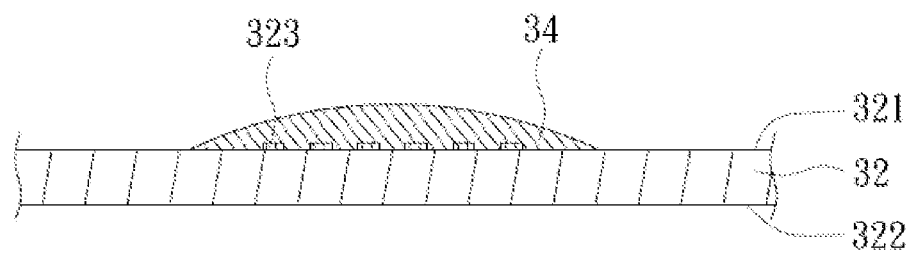

Referring to FIG. 9, a package substrate 32 (e.g., an organic substrate) is provided. The package substrate 32 has a first substrate surface 321 and a second substrate surface 322. Preferably, the package substrate 32 further comprises a plurality of substrate pads 323 disposed on the first substrate surface 321 of the package substrate 32. Then, a second protection layer 34 is formed on the first substrate surface 321 of the package substrate 32. In this embodiment, the second protection layer 34 is different from the first protection layer 26. The second protection layer 34 is a non conductive paste (NCP), and the viscosity of the second protection layer 34 is about 200 Pa-s. Notably, the viscosity of the second protection layer 34 is greater than that of the first protection layer 26, and the curing time of the second protection layer 34 is shorter than that of the first protection layer 26. In this embodiment, the second protection layer 34 may be a polymer paste, such as an epoxy paste or an acrylic paste; in other embodiments, the second protection layer 34 may also be a non-conductive film (NCF).

Figure 10:
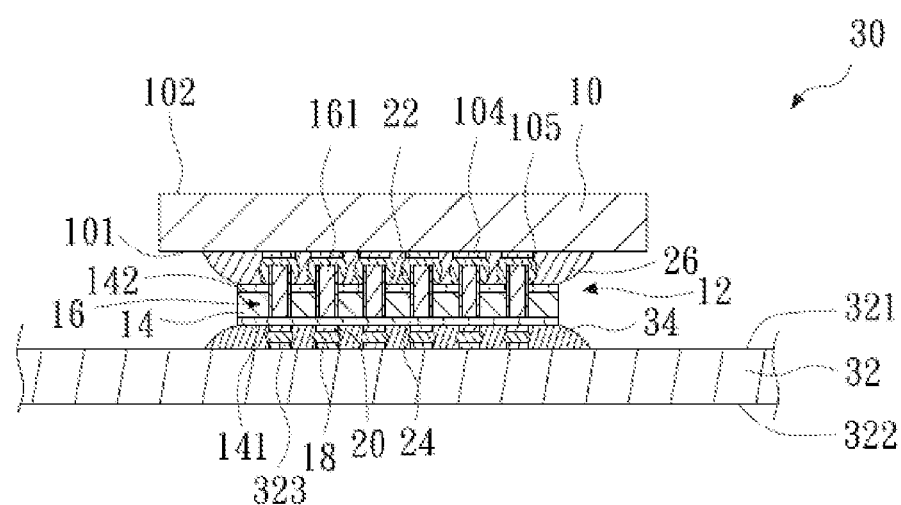

Referring to FIG. 10, the combo dice 30 are mounted to the first substrate surface 321 of the package substrate 32. In this embodiment, the combo dice 30 are mounted to the package substrate 32 by thermal compression bonding. After mounting, the first bumps 18 are electrically connected to the substrate pads 323 of the package substrate 32, and disposed in the second protection layer 34.

Figure 11:
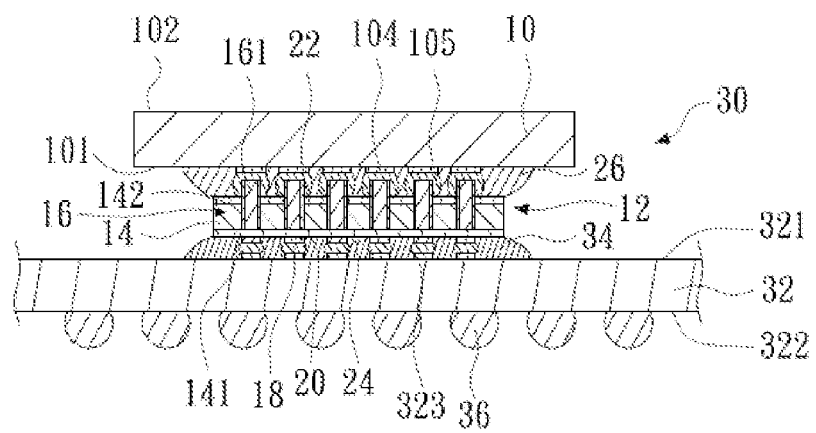

Referring to FIG. 11, a plurality of external solder balls 36 are formed on the second substrate surface 322 of the package substrate 32. Then, the package substrate 32 is cut so as to form a plurality of the stacked semiconductor packages 4 as shown in FIG. 1.

A notable feature of the present invention is that the reflow process is conducted on the wafer 1 and the first dice 12 disposed on the wafer 1 simultaneously, thereby reducing manufacturing time, and, because the material of the wafer 1 is the same as that of the first dice 12, warpage is prevented.

Moreover, the wafer 1 is thinned after the reflow process is conducted, so it is easier to hold the wafer 1 during transportation.

Figure 12:
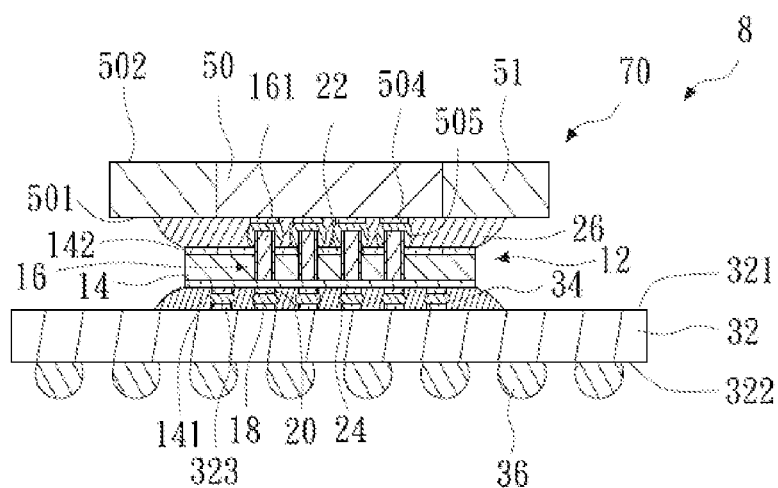
FIG. 12 is cross-sectional view illustrating a stacked semiconductor package according to another embodiment of the present invention.

Referring to FIG. 12, a cross-sectional view of a stacked semiconductor package 8, according to another embodiment of the present invention, is illustrated. The stacked semiconductor package 8 of this embodiment is similar to the stacked semiconductor package 4 (of FIG. 1), and the same elements are designated by the same reference numerals. One difference between the stacked semiconductor package 8 and the stacked semiconductor package 4 is that the width of the second die 50 of the stacked semiconductor package 8 is less than that of the first die 12, and an insulating layer 51 is disposed at the periphery of the second die 50. In this embodiment, the insulating layer 51 is an epoxy material, such as a molding compound and is used to reconstruct the second dice 50 into a wafer form when the X-Y dimension of the second die 50 is less than that of the first die 12.

The stacked semiconductor package 8 comprises a package substrate 32, a first die 12, a second die 50, a first protection layer 26, an insulating layer 51 and a second protection layer 34.

In this embodiment, the package substrate 32 is an organic substrate and has a first substrate surface 321 and a second substrate surface 322. The first die 12 is mounted to the package substrate 32. The first die 12 comprises a first die body 14, a plurality of conductive vias 16, a plurality of first bumps 18, a passivation layer 22, a functional layer 24, a surface finish layer (not shown) and a plurality of first pads 20. The first die body 14 is made of semiconductor material, such as, silicon, germanium, etc., and has a first surface 141 and a second surface 142. The conductive vias 16 are made of conductive material, such as, copper, gold, aluminum, silver, etc., and protrude from the second surface 142 of the first die 12. The first bumps 18 are disposed adjacent to the first surface 141 of the first die 12 and electrically connected to the conductive vias 16 and the first substrate surface 321 of the package substrate 32.

In this embodiment, the first bumps 18 are stacked structures made of copper pillar and solder. In other embodiments, the first bumps 18 may be made of copper pillar only or solder only. Preferably, the package substrate 32 further comprises a plurality of substrate pads 323 disposed on the first substrate surface 321, wherein the first bumps 18 are electrically connected to the substrate pads 323.

In this embodiment, the passivation layer 22 is disposed on the second surface 142 of the first die 12, and the material thereof is a polymer material, such as, benzocyclobutene (BCB), polyimide (PI), polybenzoxazole (PBO), etc., or an inorganic insulating layer, such as silicon dioxide ($SiO_2$). The functional layer 24 is disposed on the first surface 141 of the first die 12, the first pads 20 are disposed on the functional layer 24, and the first bumps 18 are disposed on the first pads 20. The surface finish layer (not shown) is made of conductive material, such as nickel (Ni), gold (Au), or a layered conductive structure, such as, nickel-gold (Ni—Au) layer, and disposed on a protruding end 161 of the conductive vias 16.

The second die 50 has a contact surface 501 and a backside surface 502. The second die 50 is mounted to the conductive vias 16 of the first die 12 by a reflow process. In this embodiment, the second die 50 further comprises a plurality of second pads 504, the second pads 504 are disposed adjacent to the contacted surface 501 of the second die 50, and the second pads 504 are electrically connected to the conductive vias 16. The width of the first die 12 is greater than that of the second die 50.

The first protection layer 26 is disposed between the second surface 142 of the first die body 14 and the contact surface 501 of the second die 50 to protect the interconnections between conductive vias 16 and the second bumps 505. In this embodiment, the first protection layer 26 is an underfill.

The second protection layer 34 is disposed between the first substrate surface 321 of the package substrate 32 and the first surface 141 of the first die body 14 to protect the first bumps 18. In this embodiment, the second protection layer 34 is a non conductive paste, such as a polymer paste, e.g., an epoxy paste or acrylic paste, and the second protection layer 34 is of a different material from the first protection layer 26. In this embodiment, the viscosity of the second protection layer 34 is greater than that of the first protection layer 26.

Preferably, the stacked semiconductor package 8 further comprises a plurality of external solder balls 36 disposed on the second substrate surface 322 of the package substrate 32.

Figure 13:
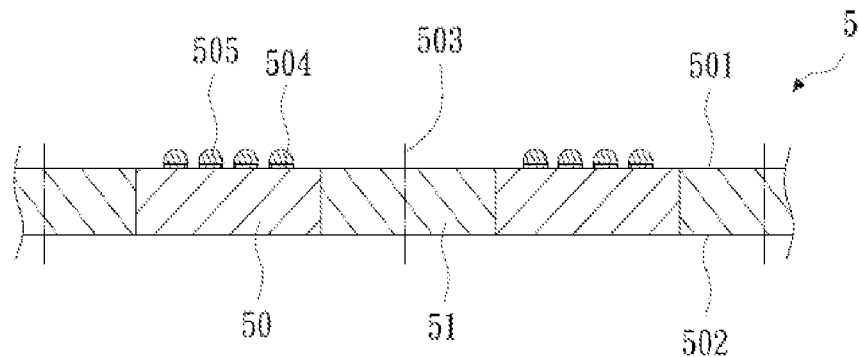
FIGS. 13 to 22 are cross-sectional views illustrating a method for making the stacked semiconductor package of FIG. 12, according to an embodiment of the present invention.

Referring to FIGS. 13 to 22, cross-sectional views of a method for making the stacked semiconductor package 8, according to another embodiment of the present invention, are illustrated. Referring to FIG. 13, a wafer 5 is provided. The wafer 5 has a contact surface 501, a backside surface 502 and a plurality of cutting lines 503. In this embodiment, the wafer 5 comprises a plurality of second dice 50 and an insulating layer 51, the second dice 50 are dice formed after cutting, and being rearranged in a manner of spacing apart from each other. The insulating layer 51 is disposed in the space between the second dice 50, and the cutting lines 503 pass through the insulating layer 51. Preferably, the wafer 5 further comprises a plurality of second pads 504 and a plurality of second bumps 505, the second pads 504 are made of conductive material, such as aluminum, silver, copper, gold, etc., and are disposed on the contact surface 501 of the second dice 50 of the wafer 5, and the second bumps 505 are made of conductive solder, such as tin-silver (SnAg) solder and disposed on the second pads 504. In other embodiments, the second bumps 505 are layered structures made of copper pillar and solder. In this embodiment, the second dice 50 are memory dice. However, in other embodiments, the second dice 50 may be processor dice, for example.

Figure 14:
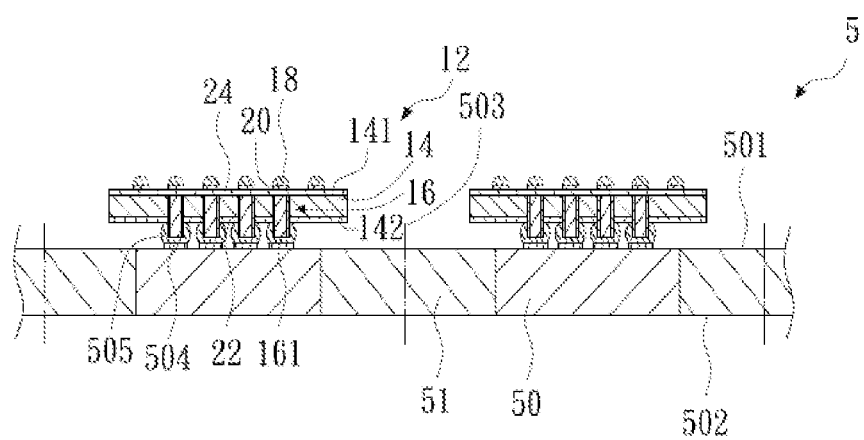

Referring to FIG. 14, a plurality of first dice 12 are provided. The first dice 12 are mounted to the contacted surface 501 of the wafer 5 by a flux layer, wherein the conductive vias 16 are electrically connected to the contacted surface 501 of the wafer 5. In this embodiment, the protruding end 161 of the conductive vias 16 contacts the second bumps 505 and therefore is electrically connected to the second pads 504 of the wafer 5.

Then, the wafer 5 and the first dice 12 disposed on the wafer 5 are put into a reflow oven together, and a reflow process is conducted on the first dice 12 and the wafer 5. In the embodiment, thermal compression bonding is not used, so the protruding end 161 of the conductive vias 16 does not contact the second pads 504. The shape deformation of the second bumps 505 is less than that caused by conventional thermal compression bonding.

Figure 15:
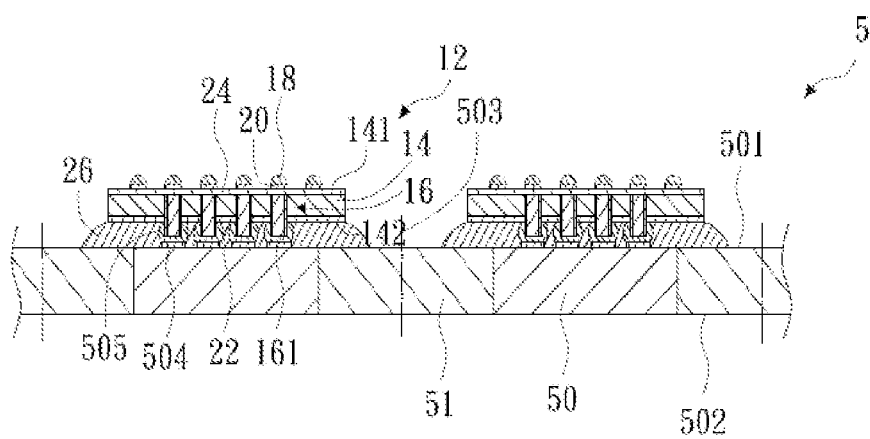

Referring to FIG. 15, a first protection layer 26 is formed between the first dice 12 and the contacted surface 501 of the wafer 5 to protect the interconnections between the conductive vias 16 and the second bumps 505. In this embodiment, the first protection layer 26 is an underfill, preferably a capillary underfill (CUF), and the first protection layer 26 fills between the second bumps 505 by the capillary phenomena.

Figure 16:
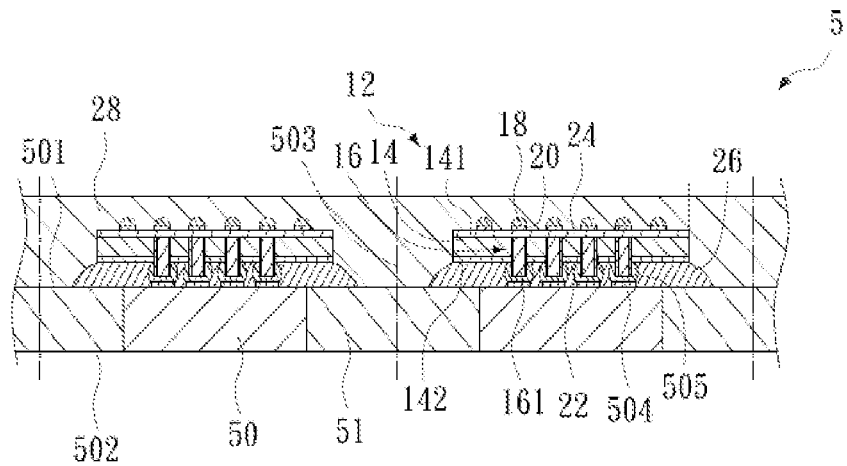
Figure 17:
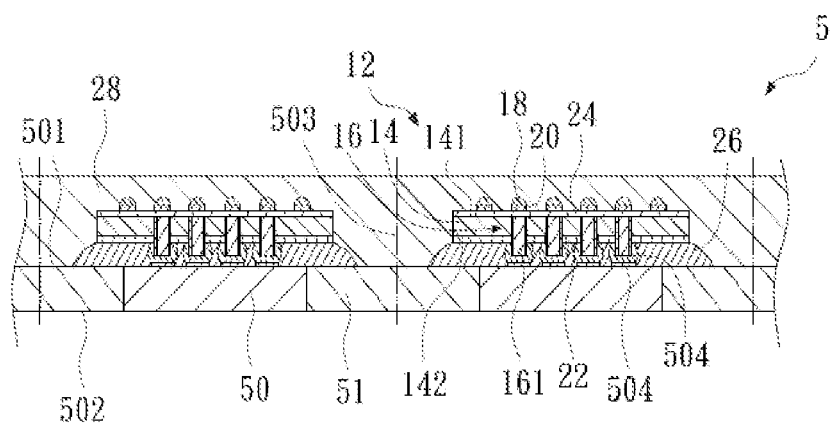
Figure 17:
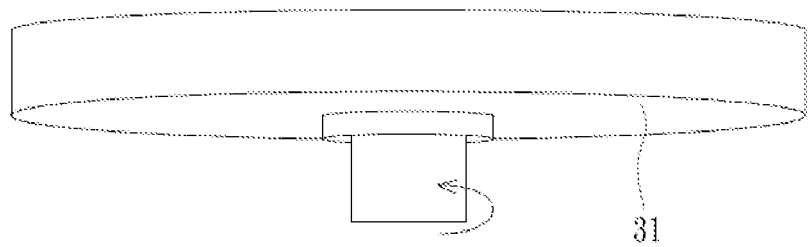

Referring to FIG. 16, the contact surface 501 of the wafer 5 and the first dice 12 disposed on the wafer 5 are adhered to a backside grinding tape 28, and the backside surface 502 of the wafer 5 is exposed. Referring to FIG. 17, the backside surface 502 of the wafer 5 is ground by a grinding machine 31 to thin the wafer 5.

Figure 18:
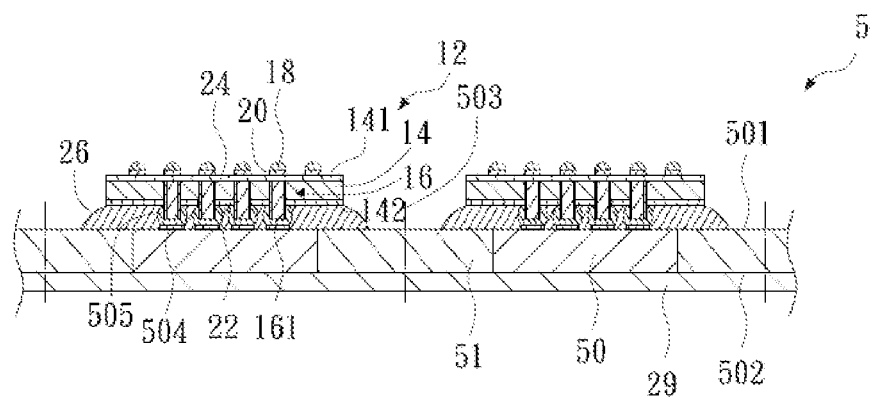
Figure 19:
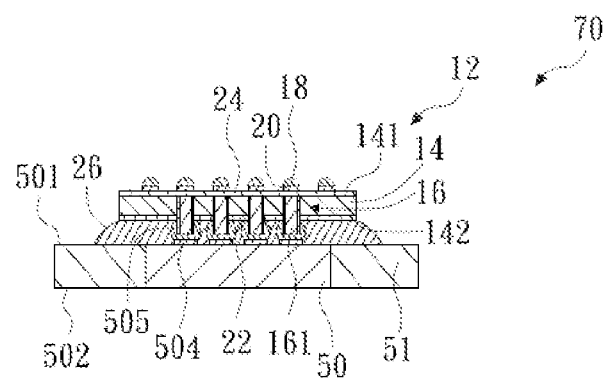

Referring to FIG. 18, the backside surface 502 of the wafer 5 is adhered to a dicing tape 29, and the contacted surface 501 of the wafer 5 and the first dice 12 disposed on the wafer 5 are exposed. Referring to FIG. 19, the wafer 5 is cut along the cutting lines 503 to form a plurality of combo dice 70. Each of the combo dice 70 comprises a first die 12, a second die 50 and an insulating layer 51. The width of the first die 12 is greater than that of the second die 50. The insulating layer 51 is disposed at the periphery of the second die 50.

Figure 20:
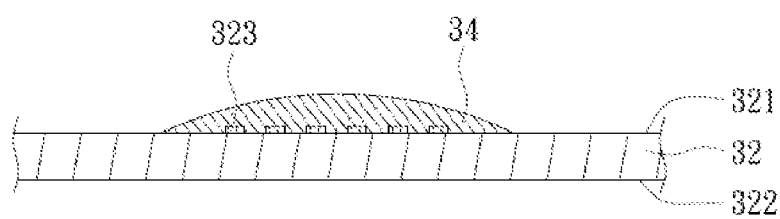

Referring to FIG. 20, a package substrate 32 is provided. The package substrate 32 has a first substrate surface 321 and a second substrate surface 322. Preferably, the package substrate 32 further comprises a plurality of substrate pads 323 disposed on the first substrate surface 321 of the package substrate 32. Then, a second protection layer 34 is formed on the first substrate surface 321 of the package substrate 32. In this embodiment, the second protection layer 34 is different from the first protection layer 26. The second protection layer 34 is a non conductive paste (NCP), and the viscosity of the second protection layer 34 is about 200 Pa-s. Notably, the viscosity of the second protection layer 34 is greater than that of the first protection layer 26, and the curing time of the second protection layer 34 is shorter than that of the first protection layer 26. In this embodiment, the second protection layer 34 may be a polymer paste, such as an epoxy paste or an acrylic paste; in other embodiments, the second protection layer 34 may also be a non-conductive film (NCF).

Figure 21:
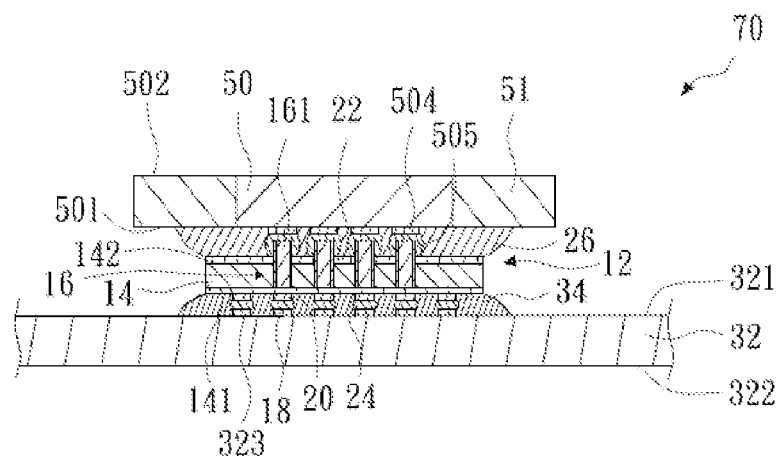
Figure 22:
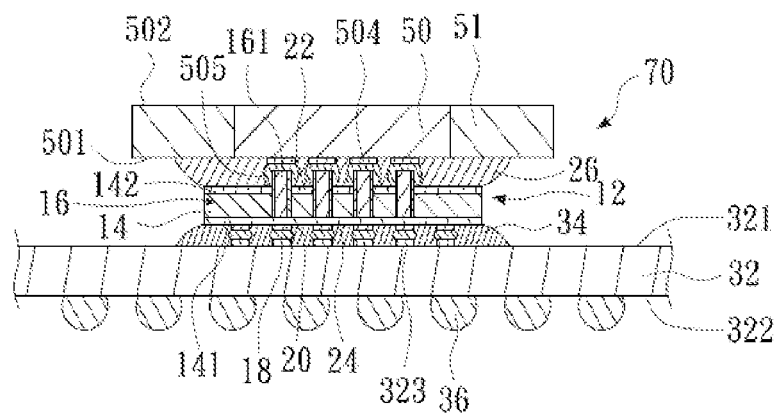

Referring to FIG. 21, the combo dice 70 are mounted to the first substrate surface 321 of the package substrate 32. After mounting, the first bumps 18 are electrically connected to the substrate pads 323 of the package substrate 32, and disposed in the second protection layer 34. Referring to FIG. 22, a plurality of external solder balls 36 are formed on the second substrate surface 322 of the package substrate 32. Then, the package substrate 32 is cut so as to form a plurality of stacked semiconductor packages 8 as shown in FIG. 12.

Figure 23:
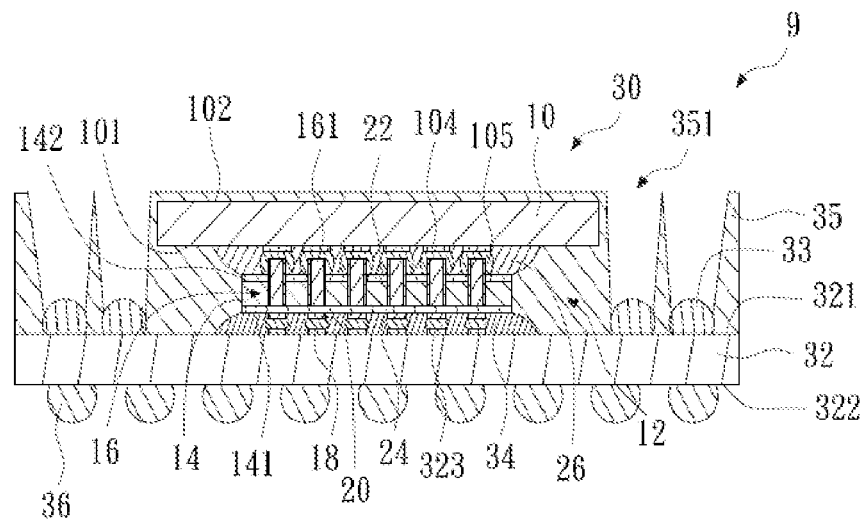
FIG. 23 is cross-sectional view illustrating a stacked semiconductor package according to another embodiment of the present invention.

Referring to FIG. 23, a cross-sectional view of a stacked semiconductor package 9, according to still another embodiment of the present invention, is illustrated. The stacked semiconductor package 9 of this embodiment is similar to the stacked semiconductor package 4 of FIG. 1, and the same elements are designated by the same reference numerals. The difference between the stacked semiconductor package 9 of this embodiment and the stacked semiconductor package 4 is that the stacked semiconductor package 9 further comprises a plurality of internal solder balls 33 and a molding compound 35. The internal solder balls 33 are disposed on the first substrate surface 321 of the package substrate 32 and outside the second protection layer 34. The molding compound 35 is disposed on the first substrate surface 321 of the package substrate 32 to encapsulate the first die 12 and the second die 10, and the molding compound 35 has a plurality of openings 351 to expose the internal solder balls 33.

Referring to FIGS. 24 to 29, cross-sectional views of a method for making a stacked semiconductor package 9, according to still another embodiment of the present invention, are illustrated. The initial steps of the method according to this embodiment (that is, the method for making the combo die 30) are the same as the method in FIGS. 2 to 7, and therefore the description is omitted.

Figure 24:
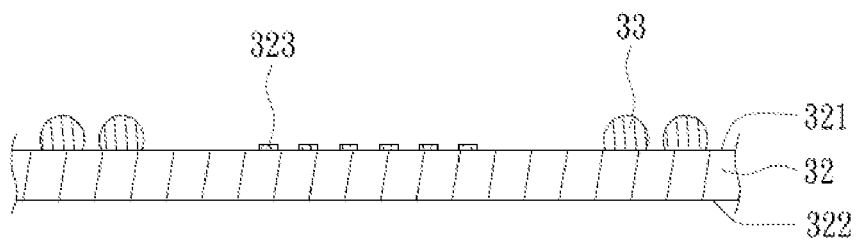
FIGS. 24 to 29 are cross-sectional views illustrating a method for making the stacked semiconductor package of FIG. 23, according to an embodiment of the present invention.
Figure 25:
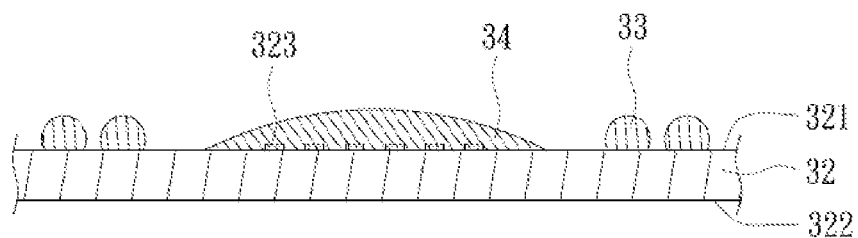

Referring to FIG. 24, a package substrate 32 is provided. The package substrate 32 has a first substrate surface 321, a second substrate surface 322 and a plurality of substrate pads 323. A plurality of internal solder balls 33 are formed on the first substrate surface 321 of the package substrate 32. Referring to FIG. 25, a second protection layer 34 is formed on the first substrate surface 321 of the package substrate 32.

Figure 26:
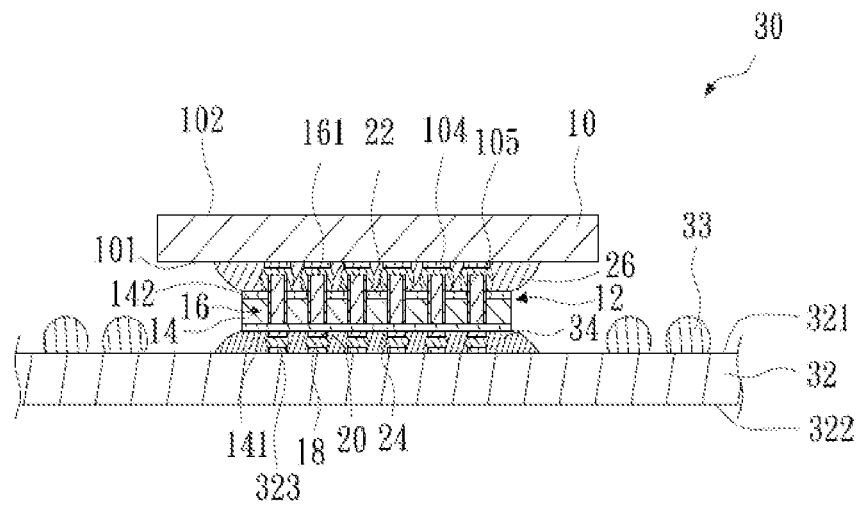
Figure 27:
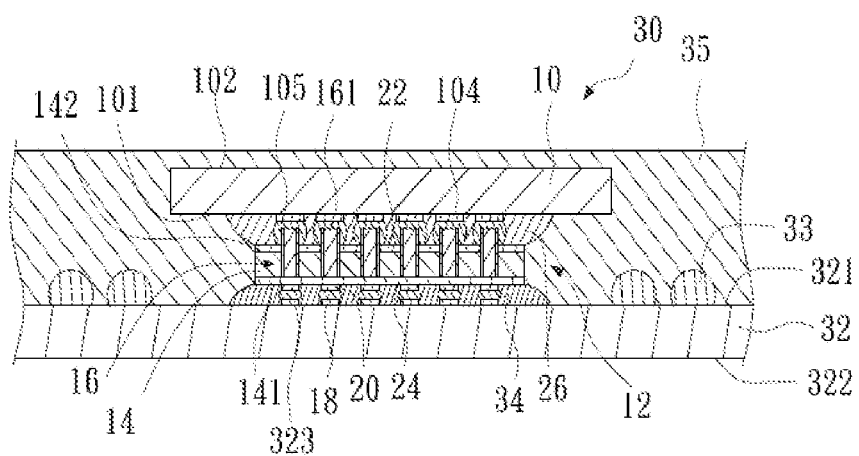

Referring to FIG. 26, the combo dice 30 are mounted to the first substrate surface 321 of the package substrate 32. After mounting, the first bumps 18 are electrically connected to the substrate pads 323, and disposed in the second protection layer 34. The second die 10 is right above the first dice 12 but does not extend to right above the internal solder balls 33. Referring to FIG. 27, a molding compound 35 is formed on the first substrate surface 321 of the package substrate 32 to encapsulate the combo dice 30 and the internal solder balls 33.

Figure 28:
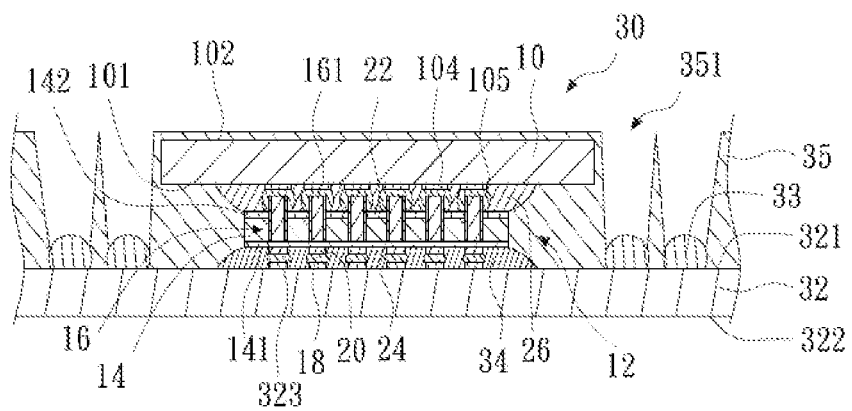
Figure 29:
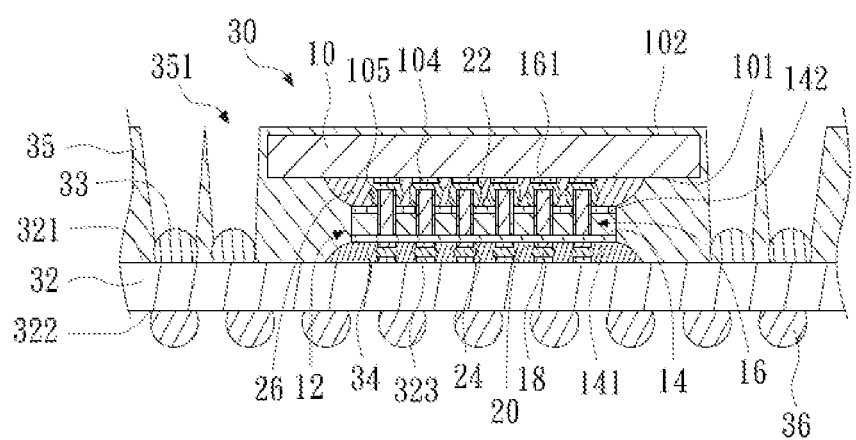

Referring to FIG. 28, a plurality of openings 351 are formed on the molding compound 35 by laser to expose the internal solder balls 33. Referring to FIG. 29, a plurality of external solder balls 36 are formed on the second substrate surface 322 of the package substrate 32. Then, the package substrate 32 is cut so as to form a plurality of stacked semiconductor packages 9, as shown in FIG. 23.

While the invention has been described and illustrated with reference to specific embodiments, these descriptions and illustrations do not limit the invention. It should be understood by those skilled in the art that various changes may be made and equivalents may be substituted without departing from the true spirit and scope of the invention as defined by the appended claims. The illustrations may not necessarily be drawn to scale. There may be distinctions between the artistic renditions in the present disclosure and the actual apparatus due to manufacturing processes and tolerances. There may be other embodiments of the present invention which are not specifically illustrated. The specification and the drawings are to be regarded as illustrative rather than restrictive. Modifications may be made to adapt a particular situation, material, composition of matter, method, or process to the objective, spirit and scope of the invention. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the invention. Accordingly, unless specifically indicated herein, the order and grouping of the operations are not limitations of the invention.

What is claimed is:

1. A method for making a semiconductor package, comprising:
   providing a wafer, the wafer having a contact surface and a backside surface;
   mounting a plurality of first die to the contact surface of the wafer, each of the first die having a plurality of conductive vias formed therein, wherein protruding ends of the conductive vias electrically connect to the contact surface of the wafer; and
   performing a reflow process.

2. The method of claim 1, further comprising:
   forming a first protection layer between each of the first die and the contact surface of the wafer; and
   thinning the wafer from the backside surface of the wafer.

3. The method of claim 2, wherein the step of thinning the wafer is performed after the step of performing the reflow process.

4. The method of claim 1, wherein the contact surface of the wafer includes thereon a plurality of pads, each of the pads having a bump, the conductive vias electrically connected to the pads by the bumps.

5. The method of claim 4, wherein the bumps include solder.

6. The method of claim 4, wherein the bumps are copper pillars capped with solder.

7. The method of claim 2, wherein the wafer is thinned to about 50μ to 100μ in thickness.

8. The method of claim 1, wherein the protruding ends of the conductive vias include a surface finish layer.

9. The method of claim 1, wherein the wafer and the plurality of first die have approximately the same coefficients of thermal expansion.

10. A method for making a semiconductor package, comprising:
    providing a wafer, the wafer having a contact surface and a backside surface, the contact surface including a plurality of pads disposed thereon, each of the pads having a bump;
    mounting a plurality of first die to the contact surface of the wafer, each of the first die having a plurality of conductive vias formed therein, wherein protruding ends of the conductive vias electrically connect to the pads by the bumps;
    placing the wafer and the plurality of first die in a reflow oven; and
    thinning the wafer from the backside surface of the wafer.

11. The method of claim 10, wherein the backside surface is thinned to about 50μ to 100μ in thickness.

12. The method of claim 10, further comprising, prior to thinning the wafer, forming a first protection layer between each of the first die and the contact surface of the wafer.

13. The method of claim 10, wherein the wafer and the plurality of first die have approximately the same coefficients of thermal expansion.

14. The method of claim 10, further comprising
    cutting the wafer to form a plurality of combo die, each of the combo die comprising one of the plurality of the first die and a second die cut from the wafer.

15. The method of claim 10, further comprising
    cutting the wafer to form a plurality of combo die, each of the combo die comprising one of the plurality of the first die and a second die cut from the wafer;
    providing a package substrate, the package substrate having a first package surface and a second package surface;
    mounting the plurality of combo die to the first package surface; and
    cutting the package substrate to form a plurality of stacked semiconductor packages.

16. The method of claim 15, wherein the X-Y dimensions of the second die are greater than the X-Y dimensions of the first die.

17. The method of claim 15, wherein the X-Y dimensions of the second die are less than the X-Y dimensions of the first die.

18. The method of claim 15, further comprising disposing at the periphery of each of the second die an insulating layer.

19. The method of claim 15, further comprising:
    forming a plurality of internal solder balls on the first package surface of the package substrate wherein a protection layer is formed between the internal solder balls;
    forming a molding compound on the first package surface of the package substrate to encapsulate the combo dice; and
    forming a plurality of openings on the molding compound to expose the internal solder balls.

20. A method for making a semiconductor package, comprising:

(a) providing a wafer, the wafer having a contact surface and a backside surface, the contact surface including a plurality of pads disposed thereon, each of the pads having a bump;
(b) mounting a plurality of first die to the contact surface of the wafer, each of the first die having a plurality of conductive vias formed therein, wherein protruding ends of the conductive vias electrically connect to the pads by the bumps;
(c) placing the wafer and the plurality of first die in a reflow oven;
(d) forming a first protection layer between each of the first die and the contact surface of the wafer; and
(e) after step (d), thinning the wafer from the backside surface of the wafer;
wherein the wafer and the plurality of first die are made of substantially the same semiconductor material.

* * * * *